United States Patent
Saen et al.

(10) Patent No.: US 9,337,838 B2
(45) Date of Patent: May 10, 2016

(54) PROGRAMMABLE CIRCUIT DEVICE AND CONFIGURATION INFORMATION RESTORATION METHOD

(71) Applicant: Hitachi, Ltd., Chiyoda-ku, Tokyo (JP)

(72) Inventors: Makoto Saen, Tokyo (JP); Takeshi Sakata, Tokyo (JP); Masashi Ohkawa, Tokyo (JP); Yusuke Kanno, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/593,029

(22) Filed: Jan. 9, 2015

(65) Prior Publication Data
US 2015/0236696 A1 Aug. 20, 2015

(30) Foreign Application Priority Data

Feb. 18, 2014 (JP) .................. 2014-028797

(51) Int. Cl.
G06F 11/07 (2006.01)
H03K 19/007 (2006.01)
H03K 19/177 (2006.01)
G06F 11/18 (2006.01)

(52) U.S. Cl.
CPC .......... *H03K 19/0075* (2013.01); *G06F 11/183* (2013.01); *G06F 11/185* (2013.01); *H03K 19/17764* (2013.01)

(58) Field of Classification Search
CPC ... G06F 11/079; G06F 11/183; G06F 11/185; G06F 11/187; G06F 11/20; G11C 29/808; H03K 19/0033; H03K 19/00392; H03K 19/23
See application file for complete search history.

(56) References Cited

U.S. PATENT DOCUMENTS

| | | | | |
|---|---|---|---|---|
| 7,236,000 B1* | 6/2007 | Steiner | ............... | H03K 19/0033 326/10 |
| 7,647,543 B2* | 1/2010 | Ng | ...................... | H03K 19/0033 326/15 |
| 2009/0089636 A1* | 4/2009 | Fernsler | .............. | G06F 11/2242 714/728 |
| 2009/0251169 A1* | 10/2009 | Gorman | ......... | H03K 19/018557 326/10 |
| 2013/0159799 A1* | 6/2013 | Brown | ........... | G01R 31/318566 714/726 |
| 2014/0164839 A1* | 6/2014 | Toba | ................ | H03K 19/17756 714/37 |

FOREIGN PATENT DOCUMENTS

JP 2013-46181 A 3/2013

* cited by examiner

*Primary Examiner* — Jason M Crawford
*Assistant Examiner* — Kurtis R Bahr
(74) *Attorney, Agent, or Firm* — Miles & Stockbridge P.C.

(57) ABSTRACT

In a device including a programmable circuit, the programmable circuit is connected to a non-volatile memory in which configuration information is stored, and another memory having a faster reading speed than the non-volatile memory, and the programmable circuit includes a configuration memory control circuit, and a signal line group for performing reading with respect to the other memory such as a volatile memory and an embedded memory from the non-volatile memory by the configuration memory control circuit, and copies a part of circuit configuration information which is required to be subjected to fast restoration from failure into the other memory.

15 Claims, 12 Drawing Sheets

A programmable circuit device, a programmable circuit device including a semiconductor integrated circuit which is able to program a circuit configuration after being manufactured by a configuration information restoration method, and a configuration information restoration method of a programmable circuit device.

PROGRAMMABLE CIRCUIT DEVICE AND CONFIGURATION INFORMATION RESTORATION METHOD

CROSS-REFERENCE TO RELATED APPLICATION

This application claims the priority of Japanese Patent Application No. 2014-028797 filed on Feb. 18, 2014, the entire contents of which are incorporated herein by reference in its entirety.

BACKGROUND OF THE INVENTION

1. Field of the Invention

The present invention relates to a programmable circuit device, a programmable circuit device including a semiconductor integrated circuit which is able to program a circuit configuration after being manufactured by a configuration information restoration method, and a configuration information restoration method of a programmable circuit device.

2. Background Art

When a programmable circuit which is a semiconductor integrated circuit able to program a circuit configuration such as a field programmable gate array (FPGA) is used, a user is able to construct an integrated circuit including an independent circuit block in a short period of time without manufacturing an LSI. The programmable circuit realizes a function by configuring a circuit function in a dedicated internal memory. Hereinafter, the dedicated memory is referred to as a "configuration memory".

The programmable circuit is able to be advantageously constructed as the independent circuit, but failure such as a radiation soft error in which information of the configuration memory is destroyed due to radiation may occur, and thus it is difficult to apply the programmable circuit to a device which requires high reliability. In particular, it is assumed that the problem is remarkable in the LSI in which the configuration memory is implemented in an SRAM.

As a method of recovering from the failure due to the radiation soft error occurred in the programmable circuit, a method in which information of a configuration memory is corrected to have the original information, and a failed circuit is reconfigured is disclosed in JP-A-2013-46181. In JP-A-2013-46181, in a configuration where the circuit is multiplexed, an aspect for reconfiguring the circuit with the failure occurring therein and restarting an operation is disclosed.

SUMMARY OF THE INVENTION

In many devices, there is a demand for improving a proportion of an operation time during which the device operates without an erroneous output. In order to improve an availability factor, it is necessary to decrease a probability of there being erroneous output, and to shorten a time for recovering from the failure.

When the programmable circuit is recovered from the failure due to the radiation soft error or the like by a reconfiguration, it is important to shorten a reconfiguration time. In particular, a circuit portion in which sufficient multiplexing such as triplication is not able to be performed due to a restriction such as the number of terminals or circuit scale is required to be restored in a short time. This is because it is difficult for a device in which a programmable circuit with a failure is mounted to perform a normal operation. In triplicated circuits, a majority circuit for connecting output signals of the triplicated circuits to a terminal of a collection chip or other circuits is a vulnerable portion. Furthermore, "vulnerable" indicates, for example, a state where the multiplexing is not performed, and/or a state where an influence is imparted to the output such that the output is changed due to output failure, and the like. In addition, even when sufficient multiplexing is performed, it is also important to shorten a time for reconfiguring the circuit in order to avoid simultaneous failure of a plurality of portions.

As described above, in order to operate the programmable circuit with a high availability factor by using the reconfiguration of the circuit, a time required therefor should be shortened. However, in JP-A-2013-46181, an aspect for shortening the reconfiguration time is not disclosed.

The present invention is made in consideration of the circumstances described above, and is to restore a configuration memory of a programmable circuit in a short time.

According to an aspect of the present invention, there is provided a programmable circuit device including a multiplexing block including a plurality of functional circuits which have an identical function and perform an identical processing; a redundant circuit notifying a diagnosis result of failure of a subject circuit and a comparison result of an output of the plurality of functional circuits without changing the output due to the failure, imparting a significant influence to the output due to the failure, or being multiplexed; a configuration control circuit copying configuration information according to a notification of the diagnosis result and the comparison result from the redundant circuit; a non-volatile memory storing functional unit configuration information relevant to the plurality of functional circuits, redundant circuit configuration information relevant to the redundant circuit, and programmable circuit configuration information including configuration information with respect to each circuit in the programmable circuit device which includes the functional unit configuration information and the redundant circuit configuration information; a volatile memory having a faster reading speed than the non-volatile memory and preliminarily copying the functional unit configuration information from the non-volatile memory; and an embedded memory having a faster reading speed than the volatile memory and preliminarily copying the redundant circuit configuration information from the non-volatile memory, in which when the redundant circuit detects the failure of the subject circuit, the redundant circuit notifies the diagnosis result to the configuration control circuit, the configuration control circuit reads the redundant circuit configuration information from the embedded memory, writes the information to a configuration memory in the redundant circuit, and thus restores the redundant circuit, when the redundant circuit detects inconsistency in signals of the plurality of functional circuits, the redundant circuit notifies the comparison result to the configuration control circuit, and the configuration control circuit reads the functional unit configuration information from the volatile memory, writes the information to each configuration memory of the plurality of functional circuits, and thus restores the plurality of functional circuits.

According to another aspect of the present invention, there is provided a configuration information restoration method of a programmable circuit device which includes a multiplexing block including a plurality of functional circuits which have an identical function and perform an identical processing, a redundant circuit notifying a diagnosis result of failure of a subject circuit and a comparison result of an output of the plurality of functional circuits without changing the output due to the failure, imparting a significant influence to the output due to the failure, or being multiplexed, and a configuration control circuit copying configuration information according to a notification of the diagnosis result and the comparison result from the redundant circuit, including storing functional unit configuration information relevant to the plurality of functional circuits, redundant circuit configuration information relevant to the redundant circuit, and programmable circuit configuration information including configuration information with respect to each circuit in the programmable circuit device which includes the functional unit configuration information and the redundant circuit configuration information in a non-volatile memory; preliminarily copying the functional unit configuration information from the non-volatile memory into a volatile memory having a faster reading speed than the non-volatile memory; and preliminarily copying the redundant circuit configuration information from the non-volatile memory into an embedded memory having a faster reading speed than the volatile memory, in which when the redundant circuit detects the failure of the subject circuit, the redundant circuit notifies the diagnosis result to the configuration control circuit, the configuration control circuit reads the redundant circuit configuration information from the embedded memory, writes the information to a configuration memory in the redundant circuit, and thus restores the redundant circuit, when the redundant circuit detects inconsistency in signals of the plurality of functional circuits, the redundant circuit notifies the comparison result to the configuration control circuit, and the configuration control circuit reads the functional unit configuration information from the volatile memory, writes the information to each configuration memory of the plurality of functional circuits, and thus restores the plurality of functional circuits.

The present invention is made in consideration of the circumstances described above, and is able to restore a configuration memory of a programmable circuit in a short time.

DETAILED DESCRIPTION OF THE INVENTION

Hereinafter, embodiments of the invention will be described with reference to the drawings.

A. OUTLINE

An outline of a representative embodiment among embodiments disclosed herein is as follows.

In order to shorten a reconfiguration time of a programmable circuit, it is effective to shorten a time for reading circuit configuration information from a memory.

In a device including the programmable circuit, the programmable circuit is connected to a non-volatile memory in which configuration information is stored and another memory having a faster reading speed than the non-volatile memory, and the programmable circuit includes a configuration memory control circuit and a signal line group for performing reading with respect to the non-volatile memory and the other memory from the configuration memory control circuit. In addition, a part of the circuit configuration information required to be subjected to fast restoration from failure is copied into the other memory having the fast reading speed. Accordingly, it is possible to shorten a restoration time of the circuit configuration information which is destroyed due to a radiation soft error or the like.

B. EMBODIMENT

Embodiment 1

Figure 1:
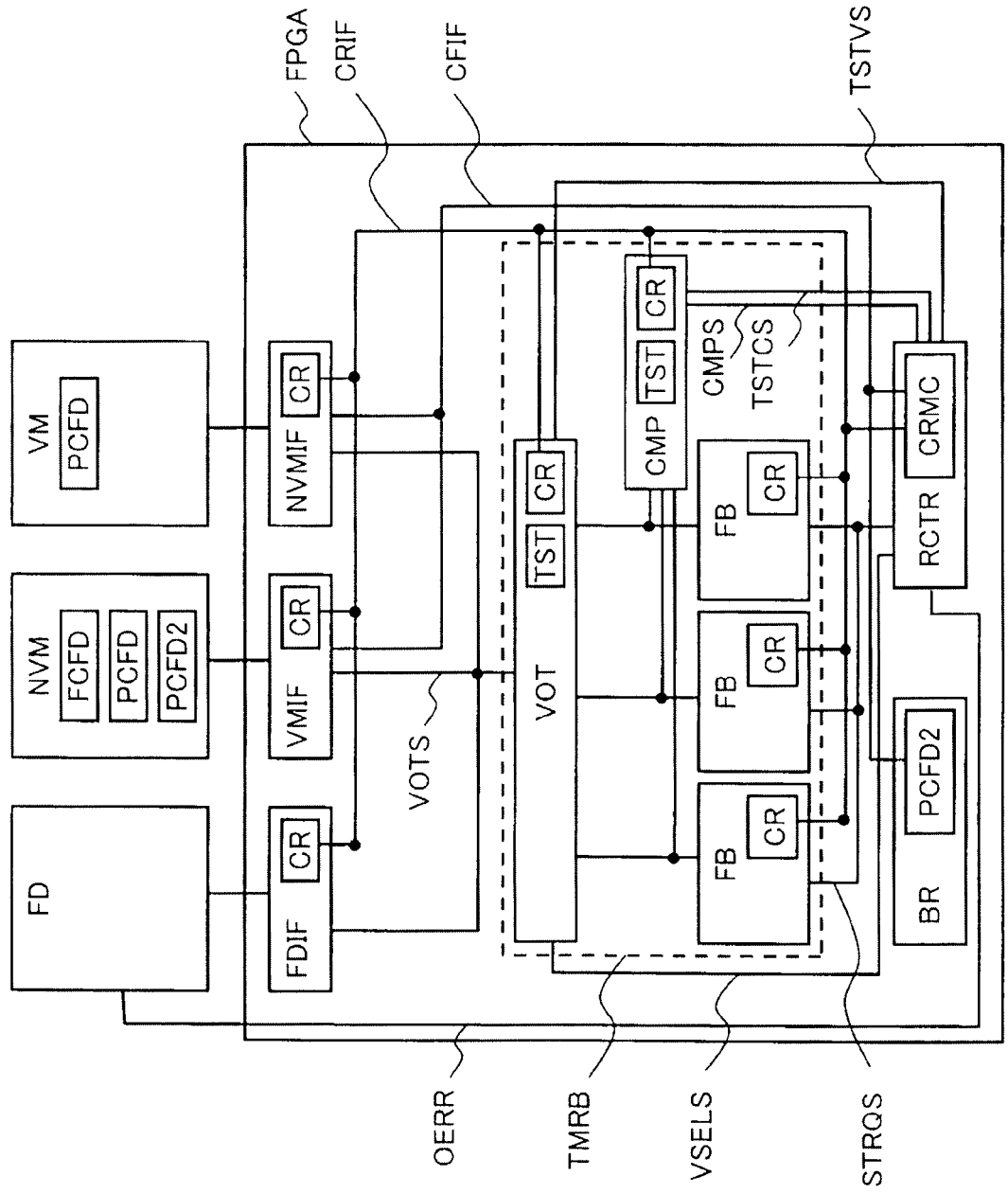
FIG. 1 is a diagram illustrating a configuration of a device which includes a programmable circuit having resistance to radiation or the like in Embodiment 1 of the invention.

FIG. 1 illustrates a configuration diagram of a programmable circuit of one embodiment of the invention. This device includes a programmable circuit FPGA, performs predetermined information processing, monitors circuit failure of the programmable circuit due to radiation or the like, and performs restoration (correction, repair, reintegration, and the like) when a failure occurs. Furthermore, in this embodiment, as an example, the description with respect to a failure due to radiation is not limited thereto, and the invention and/or this embodiment are able to be applied to various circuit failures. The circuit failure indicates failure in which an operation of the programmable circuit is different from an original operation due to occurrence of bit inversion of the configuration memory inside the programmable circuit. Restoration from failure is performed by rewriting information of the configuration memory with correct circuit information read from a memory other than the configuration memory.

In this configuration, a volatile memory VM such as a DRAM, a non-volatile memory NVM such as a flash memory, and a functional device FD such as a processor circuit or a communication circuit are connected to the programmable circuit FPGA. In this embodiment, a speed of reading information of the volatile memory by the programmable circuit is faster than a speed of reading information of the non-volatile memory by the programmable circuit. When failure occurs in an internal circuit, the programmable circuit detects the failure, has a function of performing self-restoration, and includes a volatile memory access circuit VMIF accessing the volatile memory VM, a non-volatile memory access circuit NVMIF accessing the non-volatile memory NVM, an external communication circuit FDIF accessing the functional device FD, a functional circuit FB such as a processor, a comparison circuit CMP comparing output results of the functional circuit FE, a majority circuit VOT performing a majority processing with respect to output signals of a plurality of (in this example, three) functional circuits FE, a configuration control circuit RCTR including a configuration memory control circuit CRMC and controlling a configuration of the programmable circuit, a circuit TST performing a circuit diagnosis, a configuration memory CR, and an embedded memory BR storing processing data, a program, and the like. The configuration memory CR and the embedded memory BR are distributed in each circuit block.

The configuration memory control circuit amends the configuration memory information at the time of the restoration from failure. When the restoration from failure is performed, the circuit configuration information is read from a memory such as the volatile memory VM, the non-volatile memory NVM, or the embedded memory BR other than the configuration memory, and a write operation is performed with respect to each configuration memory. The configuration information is read through a signal CFIF, and is written to each of the configuration memories through a signal CRIF. The signal CFIF is connected to the volatile memory access circuit, the non-volatile memory access circuit, and the embedded memory, and the configuration memory control circuit is able to read the circuit configuration information from these memories. The signal CRIF is connected to the configuration memory of each of the circuit blocks, and the configuration memory control circuit reads and writes content of each of the configuration memories included in the programmable circuit through the signal.

In this programmable circuit, the functional circuit is multiplexed (in this example, triplication) (a triplication block TMRB in FIG. 1) in order to prevent an erroneous output due to failure of the functional circuit FB. These three functional circuits have an identical function and perform an identical processing, and the majority circuit VOT performs the majority processing with respect to an output from the functional circuit. A result of the majority processing is an output of the triplication block TMRB, and is transmitted to the volatile memory access circuit VMIF, the non-volatile memory access circuit NVMIF, and the external communication circuit FDIF through the majority signal VOTS. In addition, the outputs of the functional circuit are continuously compared by the comparison circuit CMP, and when output information items are different from each other, it is determined that the failure has occurred in these circuits. A comparison result is notified to the configuration control circuit RCTR through a signal CMPS. In addition, the majority circuit and the comparison circuit include a diagnosis circuit TST determining whether or not the failure has occurred in the majority circuit and the comparison circuit. A diagnosis result of the majority circuit is notified to the configuration control circuit through a signal TSTVS, and a diagnosis result of the comparison circuit is notified to the configuration control circuit through a signal TSTCS.

In addition, a signal OERR is a signal for outputting occurrence of the failure in the programmable circuit to the outside through the configuration control circuit. Furthermore, the signal VSELS will be described later in Embodiment 4. Further, in this example, as a redundant circuit, the majority circuit VOT and the comparison circuit CMP are used, and only the comparison circuit CMP is able to be used, but the redundant circuit is not limited thereto, and a suitable circuit is able to be used.

Figure 2:
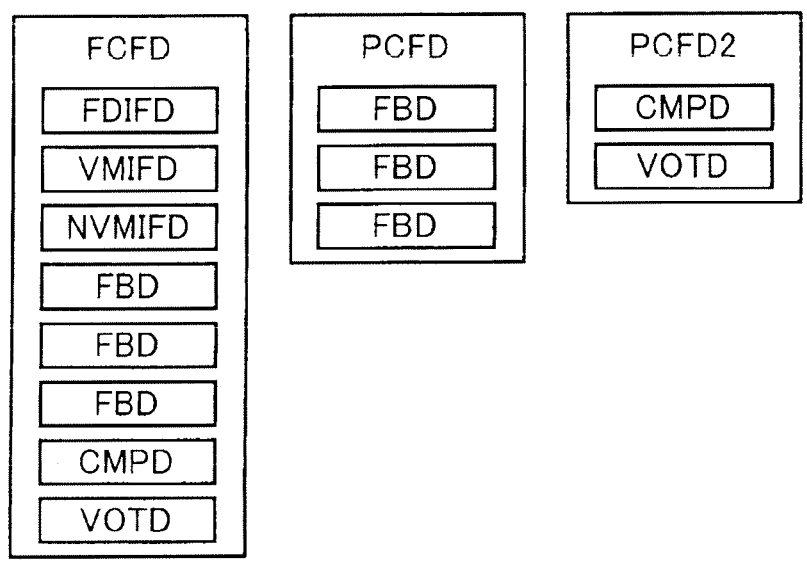
FIG. 2 is a diagram illustrating content of circuit configuration information in Embodiment 1 of the invention.

Next, the content and an arrangement of the circuit configuration information required for the operation of the programmable circuit will be described. FIG. 2 illustrates the content of the circuit configuration information in Embodiment 1. Entire circuit configuration information FCFD includes configuration information with respect to all of the circuits in the programmable circuit. Specifically, configuration information VMIFD relevant to the volatile memory access circuit, configuration information NVMIFD relevant to the non-volatile memory access circuit, configuration information FDIFD relevant to the external communication circuit, configuration information FED relevant to the functional circuit, configuration information CMPD relevant to the comparison circuit, and configuration information VOT relevant to the majority circuit are included. In the operation of the programmable circuit, functional unit configuration information PCFD used when the failure occurs in the functional circuit includes the configuration information FBD relevant to the functional circuit. Redundant circuit configuration information PCFD2 used when the failure occurs in the majority circuit and the comparison circuit includes the configuration information CMPD relevant to the comparison circuit, and the configuration information VOTD relevant to the majority circuit.

Next, the arrangement of the configuration information will be described with reference to FIG. 1. The non-volatile memory stores the entire circuit configuration information FCFD, the functional unit configuration information PCFD, and the redundant circuit configuration information PCFD2. From the information stored in the non-volatile memory, the functional unit configuration information is copied into the volatile memory at the time of initial setting after resetting the programmable circuit. In addition, from the information stored in the non-volatile memory, the redundant circuit configuration information is copied into the embedded memory BR at the time of initial setting after resetting the programmable circuit. The functional unit configuration information and the redundant circuit configuration information are copied into the other memory such as the volatile memory or the embedded memory from the non-volatile memory, and thus the time for reading the configuration information when the failure occurs is shortened, and the fast restoration from failure is performed. An order of the reading speed of the memory in this embodiment is the embedded memory, the volatile memory, and the non-volatile memory in descending order. For this reason, the circuit configuration information of the circuit required to be subjected to the fast restoration from failure is copied into the embedded memory and the volatile memory. Furthermore, in general, when the memory is implemented inside the configuration circuit, it is possible to dispose comparatively many signal lines of writing, reading, and the like, and it is possible to make a writing and reading speed faster. In particular, the majority circuit and the comparison circuit are different from the functional circuit, have low multiplicity, are vulnerable, are portions imparting a significant influence to an output result such that the output result changes due to the failure, and the like, and have a small logic scale, and thus the configuration information is arranged in the embedded memory. However, the configuration information stored in the embedded memory is not limited to these circuits.

In addition, when the embedded memory is used for other purposes, and a capacity is not sufficient, and the like, the redundant circuit configuration information may be also copied into the volatile memory. The embedded memory is also able to be configured by a normal volatile memory, and a part of the circuit configuration information stored in the non-volatile memory is copied into the other memory having the faster reading speed, and thus similarly, it is possible to speed up the restoration from failure.

An operation flow when the failure occurs in the functional circuit, the comparison circuit, and the majority circuit of the programmable circuit due to the radiation soft error or the like will be described with reference to FIGS. 3A to 3C and FIG. 1.

Figure 3A:
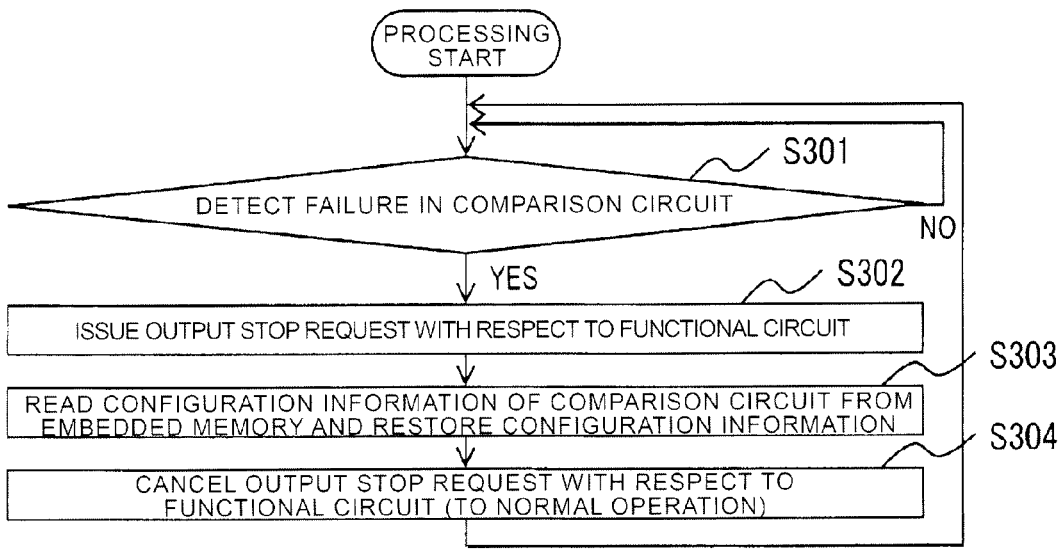
FIGS. 3A to 3C are diagrams illustrating a control flow when failure occurs due to the radiation or the like in Embodiment 1 of the invention.

FIG. 3A illustrates an operation of the configuration control circuit RCTR when the failure occurs in the comparison circuit CMP. When the failure in the comparison circuit is detected by the diagnosis circuit TST in the comparison circuit, the comparison circuit notifies the detection result to the configuration control circuit through the signal TSTCS (S301). The configuration control circuit issues an output stop request with respect to the functional circuit FB through a signal STRQS (S302), reads the configuration information of the comparison circuit from the embedded memory BR, and restores the comparison circuit (S303). At this time, the configuration memory control circuit in the configuration control circuit reads the information from the embedded memory BR through the signal CFIF, and restores the content of the configuration memory of the comparison circuit through the signal CRIF on the basis of the information. After that, the output stop request with respect to the functional circuit is cancelled (S304). The functional circuit restarts an output operation, and returns to the normal operation. In this procedure, the functional circuit which receives the output stop request temporarily suppresses the output by buffering the output signal in an internal storage unit and the like.

Figure 3B:
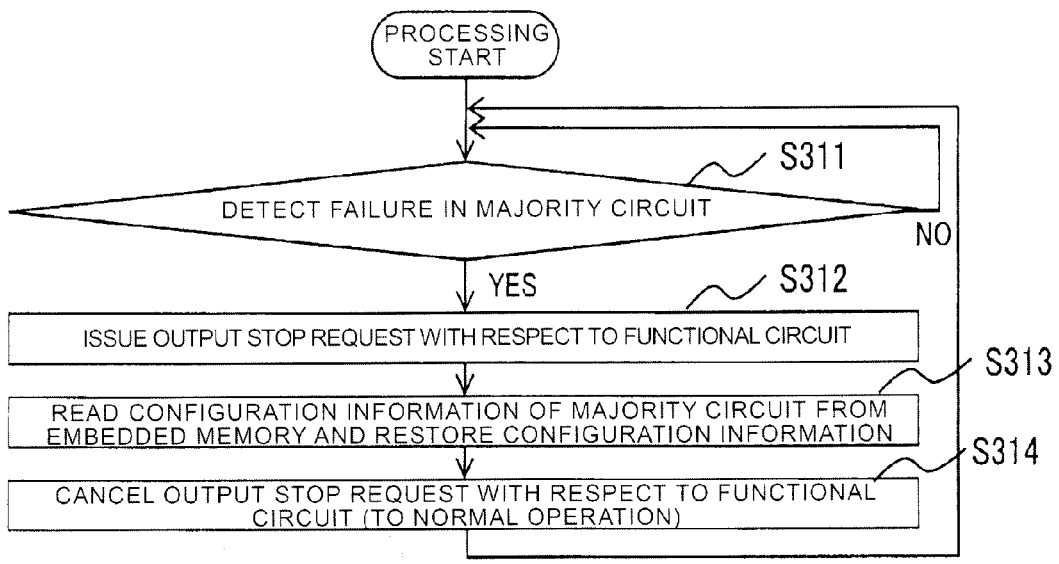

FIG. 3B illustrates an operation of the configuration control circuit when the failure occurs in the majority circuit. When the failure in the majority circuit is detected by the diagnosis circuit TST in the majority circuit, the majority circuit notifies the detection result to the configuration control circuit through the signal TSTVS (S311). The configuration control circuit issues the output stop request with respect to the functional circuit FB through the signal STRQS (S312), reads the configuration information of the majority circuit from the embedded memory BR, and restores the majority circuit (S313). At this time, the configuration memory control circuit in the configuration control circuit reads the information from the embedded memory BR through the signal CFIF, and restores the content of the configuration memory of the majority circuit through the signal CRIF on the basis of the information. After that, the output stop request with respect to the functional circuit is cancelled (S314). The functional circuit restarts the output operation, and returns to the normal operation. In this procedure, the functional circuit which receives the output stop request temporarily suppresses the output by buffering the output signal in the internal storage unit.

Figure 3C:
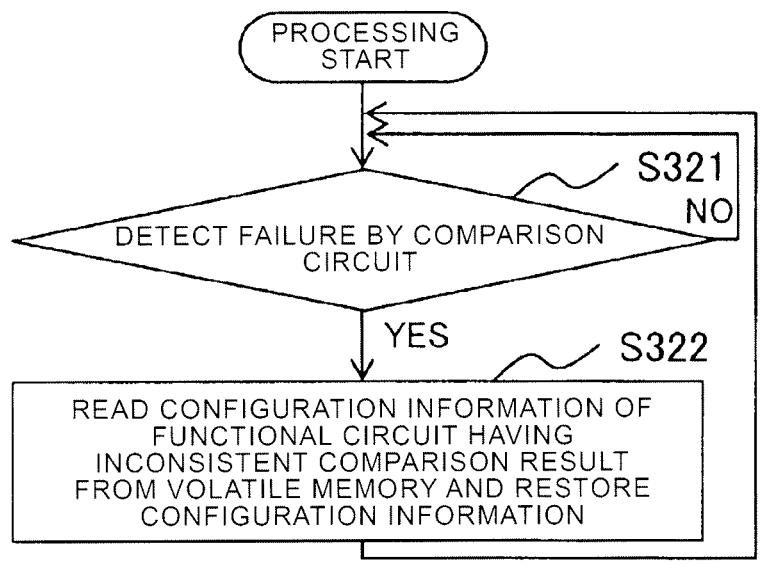

FIG. 3C illustrates an operation of the configuration control circuit when the failure of the functional circuit is detected by the comparison circuit. When the comparison circuit detects inconsistency in the outputs of the functional circuit, the comparison circuit notifies the detection result to the configuration control circuit through the signal CMPS (S321). The configuration control circuit operates the configuration memory control circuit, reads the information from the volatile memory through the signal CFIF, and restores the content of the configuration memory of the functional circuit through the signal CRIF on the basis of the information (S322). The functional circuit is triplicated, and thus the configuration memory is restored without stopping the functional circuit unless it is detected that all circuit outputs are different from each other by the comparison circuit. Furthermore, the configuration memory may be restored by stopping the functional circuit.

In this Embodiment 1, a configuration in which the functional circuit such as the processor is multiplexed and thus has high reliability is described as an example, and an application target of the configuration is not limited to the functional circuit. The same method is able to be applied to a circuit other than the volatile memory access circuit, the non-volatile memory access circuit, the external communication circuit, or the like.

According to this embodiment, the configuration memory of the programmable circuit is recovered from a soft error in a short time, and thus it is possible to improve an availability factor of a device on which the programmable circuit is mounted.

Embodiment 2

In Embodiment 2, an aspect in which a terminal of a programmable circuit connected to a non-volatile memory and a terminal of a programmable circuit connected to a functional device are shared will be described in comparison to Embodiment 1 described above. At the time of initial setting, necessary circuit configuration information and software processing information of a software program or the like are copied into another memory from the non-volatile memory, and after that, the terminal of the programmable circuit connected to the non-volatile memory is switched to be connected to the functional device. Accordingly, it is possible to realize a function by using a programmable circuit including a small number of terminals.

Figure 4:
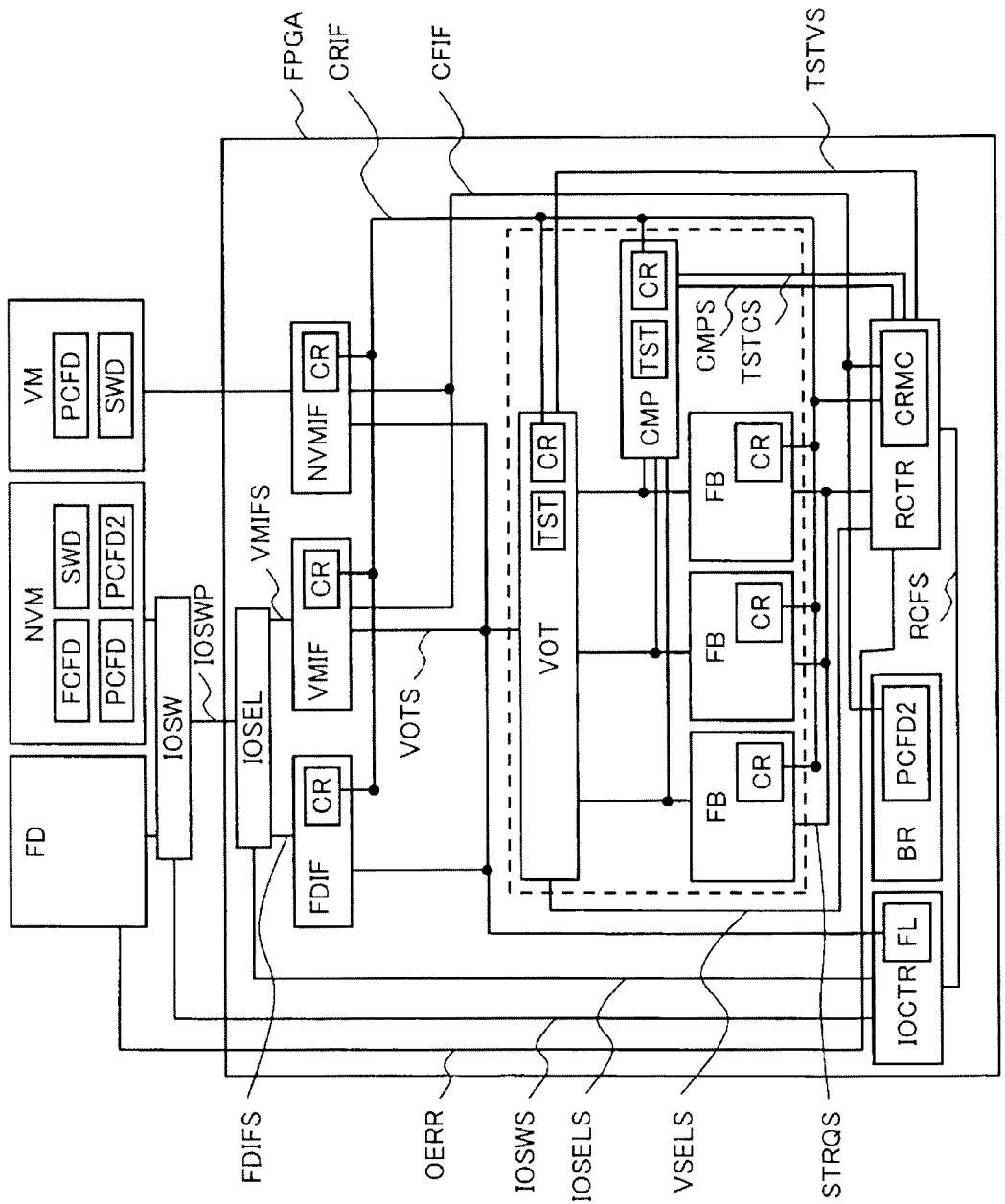
FIG. 4 is a diagram illustrating a configuration of a device which includes a programmable circuit having resistance to radiation or the like in Embodiment 2 of the invention.

FIG. 4 illustrates a configuration diagram of a programmable circuit in Embodiment 2. In this aspect, functional circuit configuration information is copied into a volatile memory VM, and configuration information of a majority circuit and a comparison circuit is copied into an embedded memory BR.

From a viewpoint of a circuit configuration, this Embodiment 2 is different from Embodiment 1 in that an IO selection circuit IOSEL is arranged between a non-volatile memory access circuit VMIF and an external communication circuit FDIF, and the terminal of the programmable circuit, a switch device IOSW is arranged between the non-volatile memory and the functional device, and the programmable circuit, and an IO control circuit IOCTR for controlling the IO selection circuit and the switch device is arranged in the programmable circuit.

The IO selection circuit is a circuit which selects any one of a signal VMIFS allowing access between the non-volatile memory access circuit and the non-volatile memory and a signal FDIFS allowing access between the external communication circuit and the outside processing device according to a selection signal IOSELS, and connects the selected signal to a signal IOSWP relevant to the switch device. The switch device is a circuit which connects the signal IOSWP from the terminal of the programmable circuit to the non-volatile memory or the functional device according to the selection signal IOSWS. The IO control circuit is a circuit which controls the IO selection circuit through the selection signal IOSELS, and controls the switch device IOSW through the selection signal IOSWS. A register FL of the IO control circuit is a register for setting completion of copying of the software processing information in the IO control circuit. In this configuration, the completion of the copying of the software processing information is set by the functional circuit after the copying of the software processing information is completed by the functional circuit.

A control flow when the programmable circuit is switched to be connected to the functional device from the non-volatile memory will be described with reference to FIG. 5 and FIG. 4. When this switch processing is started, the IC control circuit controls the IO selection circuit and the switch device, and selects the non-volatile memory. Then, the configuration control circuit reads the entire circuit configuration information FCFD stored in the non-volatile memory, writes the information to a configuration memory of the programmable circuit, and configures the programmable circuit (S501).

Next, the configuration control circuit reads functional unit configuration information FCFD from the non-volatile memory, and writes the information to the volatile memory (S502), and in addition, reads redundant configuration information PCFD2 from the non-volatile memory, and writes the information to the embedded memory (S503). After copying of configuration information of a partial circuit is completed, the configuration control circuit notifies the completion of the copying to the IO control circuit through the signal RCFS (S504).

In the non-volatile memory, software information SWD which is a software program such as an OS may be stored in addition to the circuit configuration information. In such a case, it is necessary that the software information be copied from the non-volatile memory before the programmable circuit is switched to be connected to the functional device from the non-volatile memory. In this embodiment, the functional circuit copies the software information from the non-volatile memory NVM into the volatile memory VM (S505 and S506). For this reason, the IO control circuit waits for the completion of the copying of the software information from the non-volatile memory into the volatile memory by the functional circuit. The functional circuit writes a predetermined value to the control register FL in the IO control circuit, and thus the completion of the copying is notified. After the copying of the circuit configuration information and the software information is completed, the IO control circuit outputs the signal IOSELS and the signal IOSWS to the IO selection circuit and the switch device such that the programmable circuit is switched to be connected to the functional device from the non-volatile memory (S507).

Furthermore, an operation flow when failure occurs in the functional circuit, the comparison circuit, and the majority circuit of the programmable circuit due to a radiation soft error or the like is identical to that of Embodiment 1.

According to the processing described above, the programmable circuit is connected to the volatile memory and the functional device, and thus starts to execute a normal information processing. A control flow when an error occurs due to radiation or the like during the normal information processing is identical to that of Embodiment 1.

As described above, according to this embodiment, in addition to the effects described in Embodiment 1, the terminal of the programmable circuit connected to the non-volatile memory which is required at the time of the initial setting is switched to be connected to another functional device, and thus it is possible to connect many devices to the programmable circuit including a fewer number of terminals. Accordingly, it is possible to realize high functionalization and a high performance of a device at limited cost.

Embodiment 3

Figure 6:
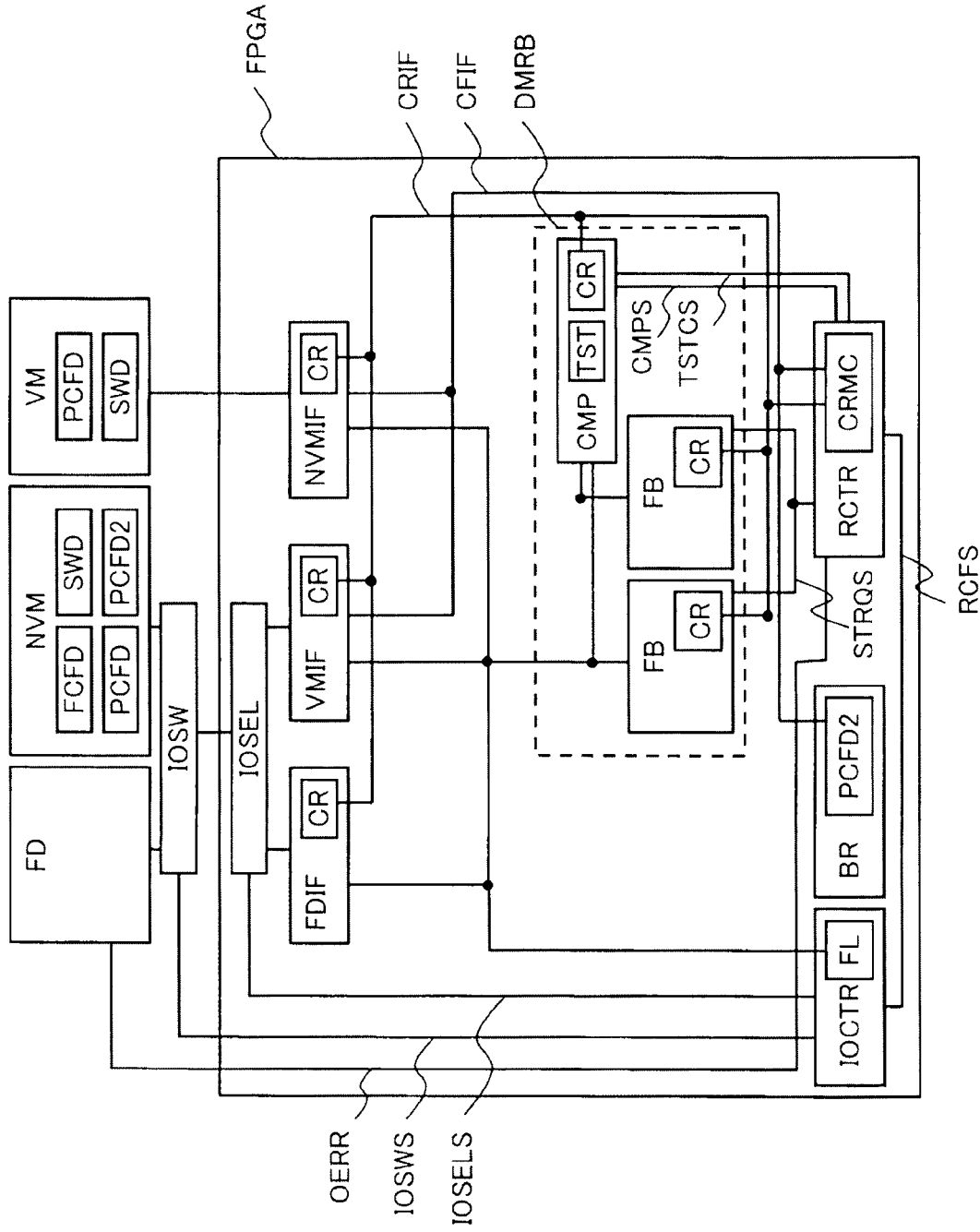
FIG. 6 is a diagram illustrating a configuration of a device which includes a programmable circuit having resistance to radiation or the like in Embodiment 3 of the invention.

FIG. 6 illustrates a configuration diagram of a programmable circuit in this Embodiment 3. Similar to Embodiment 2 described above, in this embodiment, a volatile memory VM, a non-volatile memory NVM, and a functional device FD are connected to a programmable circuit, and the programmable circuit has a function of detecting failure when the failure occurs inside the programmable circuit, and performing self-restoration.

In the programmable circuit in this embodiment, the functional circuit is duplicated (DMRB in FIG. 6) in order to prevent an erroneous output due to failure of a functional circuit FB. These two functional circuits have an identical function and perform an identical processing, and outputs of two functional circuits FB are monitored by a comparison circuit CMP. The programmable circuit includes a volatile memory access circuit VMIF, a non-volatile memory access circuit NVMIF, an external communication circuit FDIF, a configuration control circuit RCTR, a configuration memory control circuit CRMC, an IO control circuit IOCTR, a circuit diagnosis circuit TST, a configuration memory CR, and an embedded memory BR in addition to the functional circuit and the comparison circuit.

Figure 7:
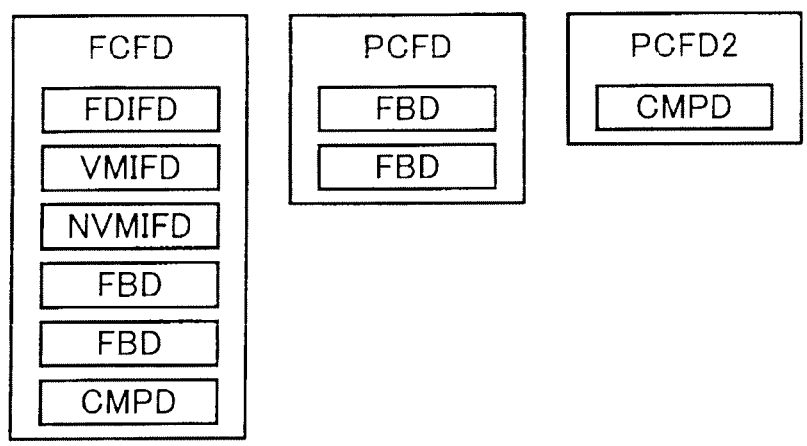
FIG. 7 is a diagram illustrating content of circuit configuration information in Embodiment 3 of the invention.

FIG. 7 illustrates content of circuit configuration information. Entire circuit configuration information FCFD is information used at the time of starting the programmable circuit, and includes configuration information with respect to all of the circuits in the programmable circuit. Specifically, VMIFD relevant to the volatile memory access circuit, NVMIFD relevant to the non-volatile memory access circuit, FDIFD relevant to the external communication circuit, FBD relevant to the functional circuit, and CMPD relevant to the comparison circuit are included. Functional circuit configuration information PCFD used when failure occurs in the functional circuit includes configuration information FBD relevant to the functional circuit. Configuration information PCFD2 used when failure occurs in the comparison circuit includes configuration information CMPD relevant to the comparison circuit. Similar to Embodiment 2, in the non-volatile memory, software information SWD which is a software program such as an OS may also be stored in addition to the circuit configuration information.

In this embodiment, in the non-volatile memory, the entire circuit configuration information, the functional unit configuration information, and redundant circuit configuration information are stored. The functional unit configuration information in the non-volatile memory is copied into the volatile memory at the time of initial setting after resetting the programmable circuit. In addition, the redundant circuit configuration information in the non-volatile memory is copied into the embedded memory at the time of the initial setting after resetting the programmable circuit.

The functional unit configuration information and the redundant circuit configuration information are copied into another memory from the non-volatile memory, and thus similar to Embodiment 1 or Embodiment 2, a time for reading the configuration information when the failure occurs is shortened, and the fast restoration from failure is performed. An order of the reading speed of the memory in this embodiment is the embedded memory, the volatile memory, and the non-volatile memory in descending order. For this reason, the circuit configuration information of the circuit required to be subjected to the fast restoration from failure is copied into the embedded memory and the volatile memory.

Figure 5:
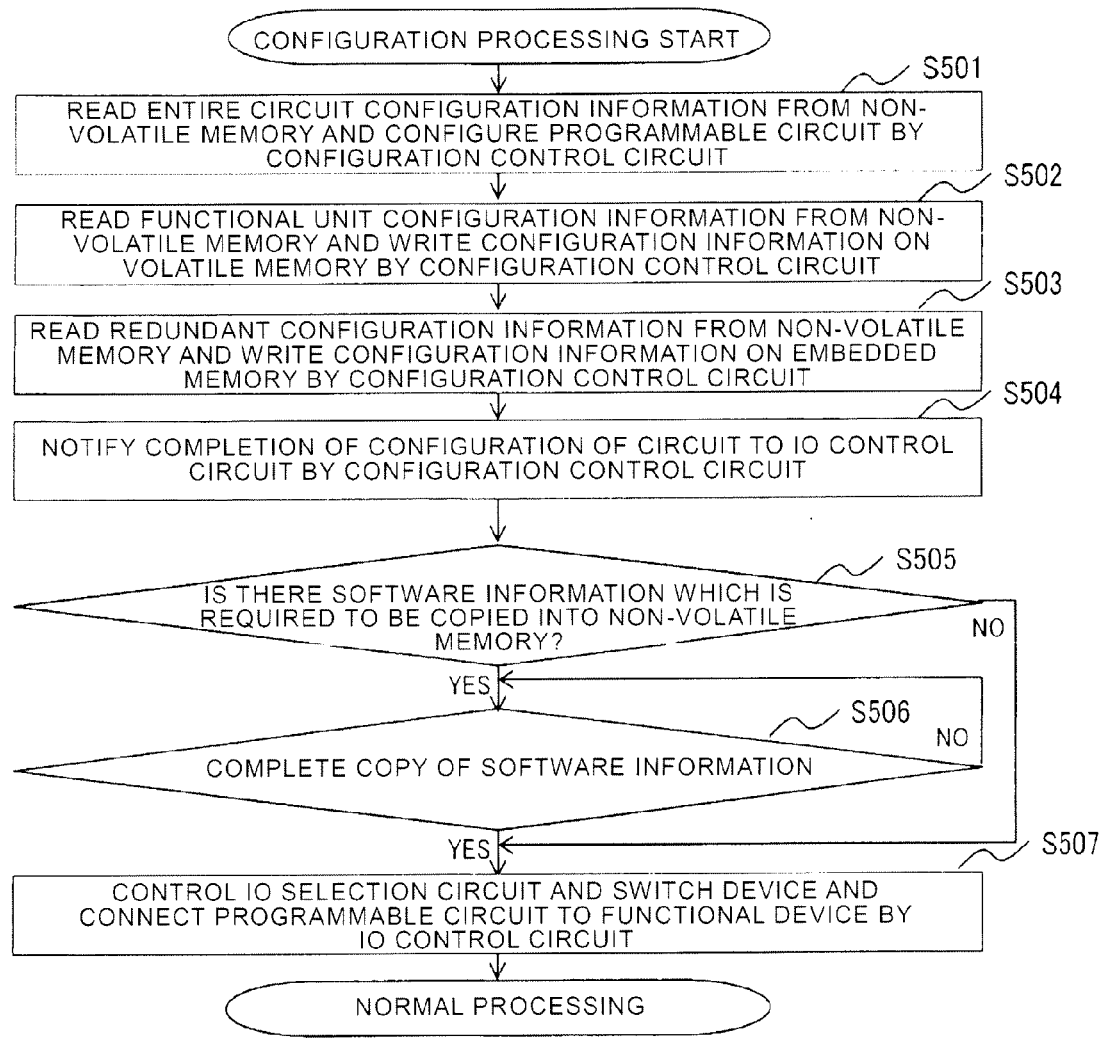
FIG. 5 is a diagram illustrating a control flow when circuit configuration information is set in Embodiment 2 of the invention.

Furthermore, a control flow when the programmable circuit is switched to be connected to the functional device from the non-volatile memory is identical to that of Embodiment 2 (FIG. 5 or the like).

An operation flow when failure occurs in the functional circuit or the comparison circuit of the programmable circuit will be described with reference to FIGS. 8A and 8B and FIG. 6.

Figure 8A:
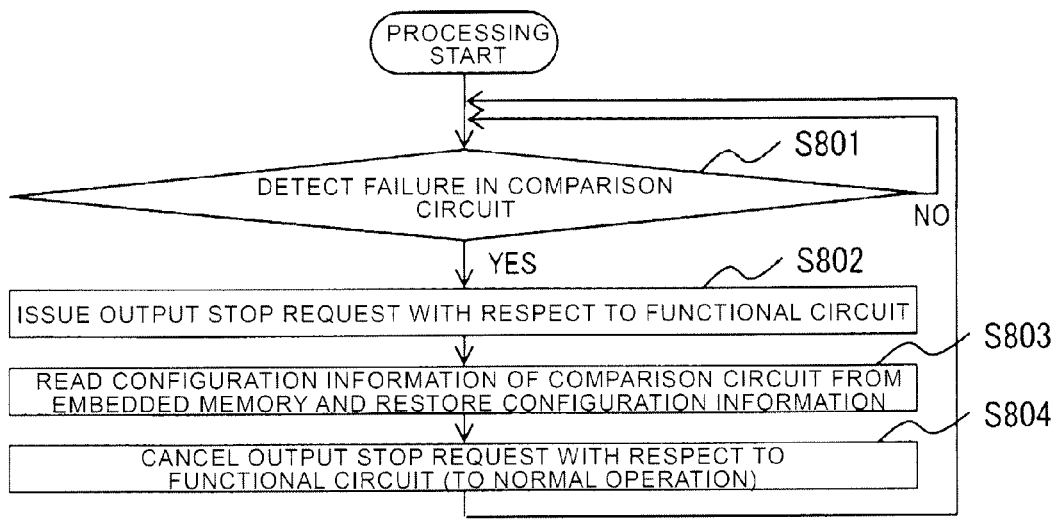
FIGS. 8A and 8B are diagrams illustrating a control flow when the failure occurs due to the radiation or the like in Embodiment 3 of the invention.

FIG. 8A illustrates an operation of the configuration control circuit RCTR when the failure occurs in the comparison circuit CMP. When the failure in the comparison circuit is detected by the diagnosis circuit in the comparison circuit, the comparison circuit notifies the detection result to the configuration control circuit through a signal TSTCS (S801). The configuration control circuit issues an output stop request with respect to the functional circuit through a signal STRQS (S802), reads the configuration information of the comparison circuit from the embedded memory BR, and restores the comparison circuit (S803). At this time, the configuration memory control circuit in the configuration control circuit reads the information from the embedded memory BR through a signal CFIF, and restores content of the configuration memory of the comparison circuit through a signal CRIF on the basis of the information. After that, the output stop request with respect to the functional circuit is cancelled (S804). The functional circuit restarts an output operation, and returns to a normal operation. In this procedure, the functional circuit which receives the output stop request temporarily suppresses the output by buffering an output signal in an internal storage unit.

Figure 8B:
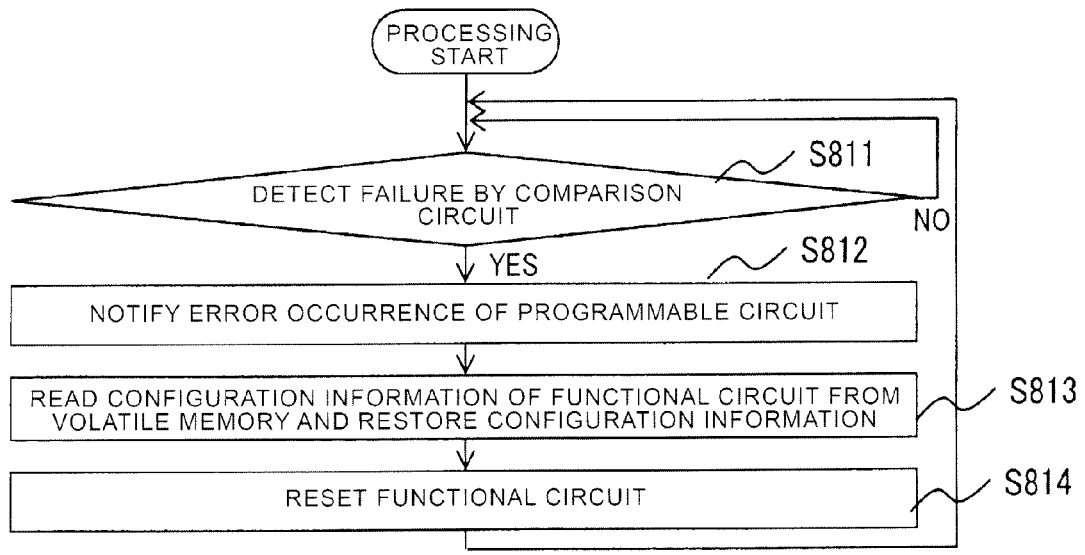

FIG. 8B illustrates an operation of the configuration control circuit when the failure of the functional circuit is detected by the comparison circuit. When the comparison circuit detects inconsistency in outputs of the functional circuit, the comparison circuit notifies the detection result to the configuration control circuit through a signal CMPS (S811). The configuration control circuit, first, notifies an outside of the programmable circuit that the failure has occurred through a signal OERR (S812). In this embodiment, the notification is performed with respect to the FD of an external LSI, but a notification destination is not limited thereto. Next, the configuration control circuit operates the configuration memory control circuit, reads the information from the non-volatile memory through the signal CFIF, and restores the content of the configuration memory of the functional circuit through the signal CRIF on the basis of the information (S813). After a restoration processing is completed, the functional circuit is reset and the processing is restarted, and completion of the restoration is notified to an outside of the programmable LSI through the signal OERR (S814).

Figure 11:
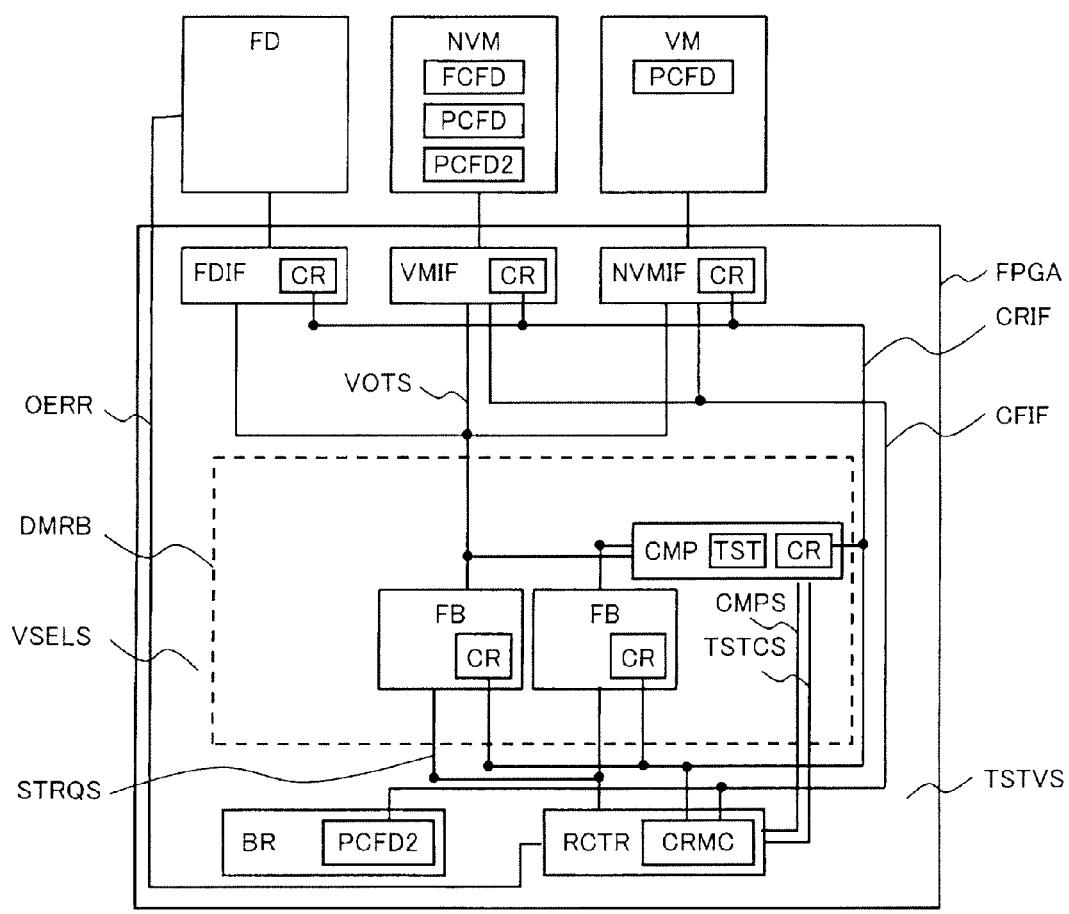
FIG. 11 is a diagram illustrating a modification example of the device which includes the programmable circuit having resistance to radiation or the like in Embodiment 3 of the invention.

FIG. 11 is a diagram illustrating a modification example of a device which includes a programmable circuit having resistance to radiation or the like in Embodiment 3 of the invention. As illustrated, by using the programmable circuit configuration of Embodiment 1, a configuration in which the triplication block TMRB of FIG. 1 is replaced by the duplication block DMRB of FIG. 6 in Embodiment 3 may be used as a modification example of Embodiment 3. Furthermore, in this case, the selection signal VSELS from the configuration control circuit RCTR is not necessary.

As described above, in Embodiment 1 to Embodiment 3, the configuration control circuit of the programmable circuit is connected not only to the non-volatile memory but also to the volatile memory and the embedded memory. In addition, the aspect in which the circuit configuration information of the circuit required to be subjected to the fast restoration from failure is arranged in the memory having a fast speed for reading the information from the programmable circuit (in this Embodiments 1 to 3, the volatile memory and the embedded memory), and thus a recovery time from the failure due to the radiation soft error or the like is shortened is described.

Accordingly, according to this embodiment, in addition to the effects described in Embodiment 1, it is possible to improve an availability factor of a device on which the programmable circuit is mounted.

Embodiment 4

Figure 9:
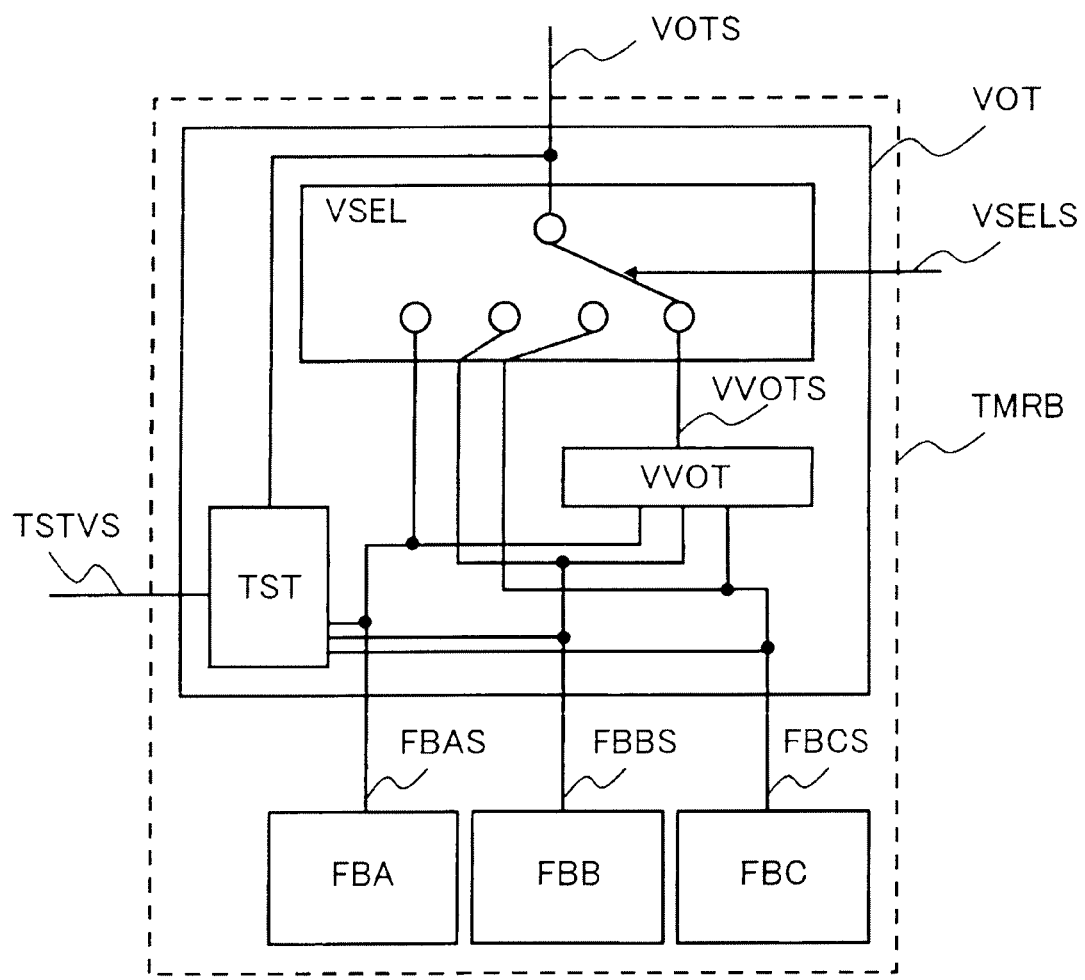
FIG. 9 is a diagram illustrating a configuration of a majority circuit in Embodiment 4 of the invention.

Another aspect of the majority circuit of Embodiment 1 will be described with reference to FIG. 9.

Characteristics of this majority circuit VOT are having a function of directly outputting output values of functional circuits (FBA, FBB, and FBC) without performing the majority processing. An output of the majority circuit is able to be selected from a signal VVOTS of a majority processing result of three functional circuit outputs, and output signals FBAS, FBBS, and FBCS of the functional circuit, and which signal is selected from the four signals is able to be designated according to a signal value of a selection signal VSELS. Furthermore, in FIG. 9, in order to describe the functional circuit easily, the three functional circuits FBA, FBB, and FBC are distinguished, but have an identical function.

The majority circuit VOT includes a majority execution circuit VVOT, a selector circuit VSEL selecting one from four inputs according to the value of the signal VSELS, and a diagnosis circuit TST. The majority execution circuit is a circuit performing a majority processing with respect to values of a signal FBAS, a signal FBBS, and a signal FBCS. The selector circuit selects one signal from the majority result signal VVOTS, the signal FBAS, the signal FBBS, and the signal FBCS according to the selection signal VSELS, and outputs the signal to a signal VOTS. The diagnosis circuit is a circuit for diagnosing whether or not failure has occurred in the majority execution circuit and the selector circuit.

A function of directly outputting an output of the functional circuit without performing the majority processing is able to be used for verifying an operation of each functional circuit in an actual field. For example, a value of the selection signal VSELS is applied such that an output of the majority circuit VOT is an output FBAS of the functional circuit FBA, and thus it is possible to invalidate the functional circuit FBB and the functional circuit FBC. In addition, by executing an input pattern for a preliminarily prepared test, it is possible to verify an operation of the functional circuit FBA.

As described above, according to an effect of applying this majority circuit, one of the multiplexed functional circuits is selected, and thus an operation of each mechanism circuit is able to be verified.

Embodiment 5

Figure 10:
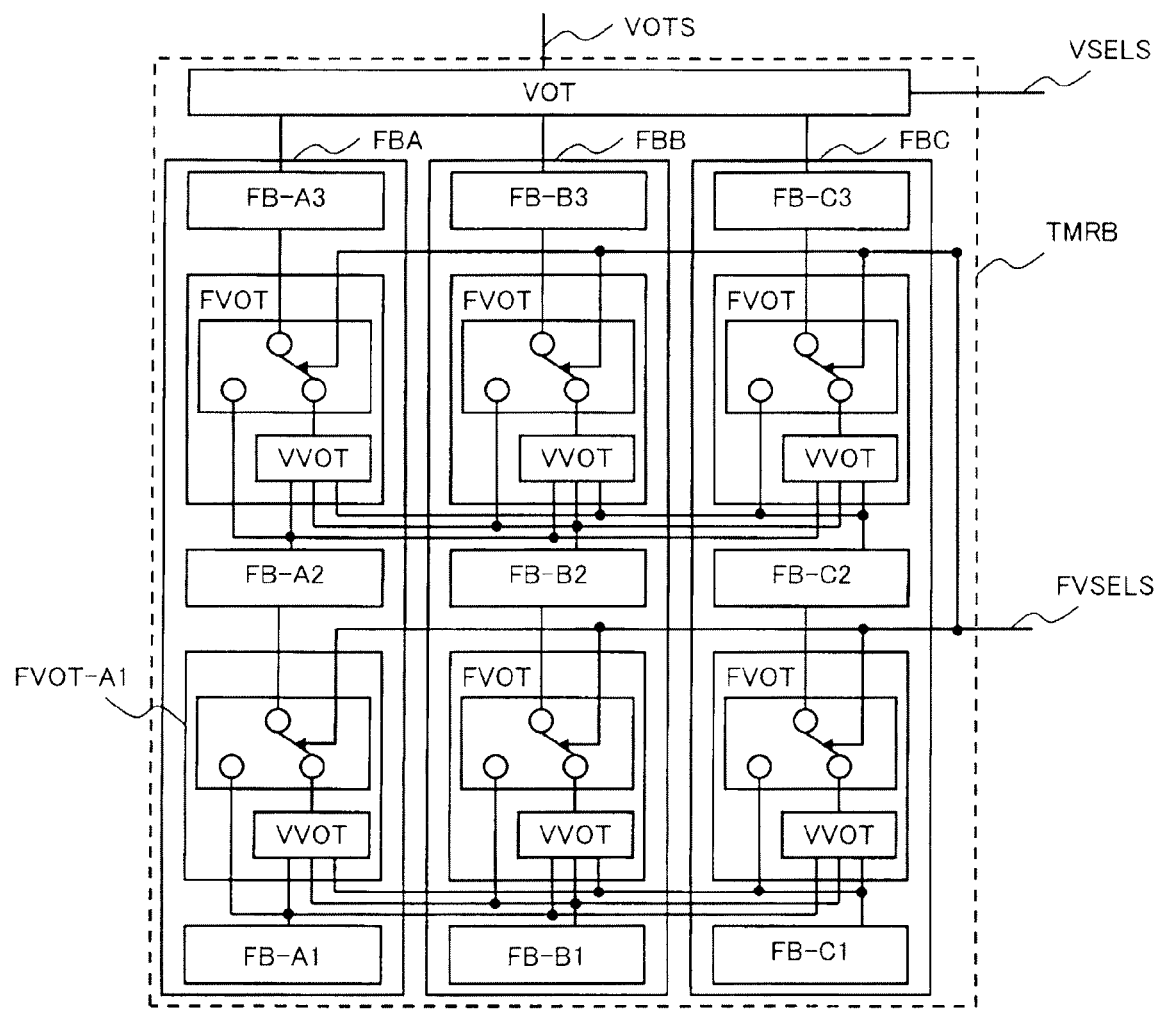
FIG. 10 is a diagram illustrating a configuration which triplicates a functional circuit by using a majority circuit in Embodiment 5 of the invention.

FIG. 10 is another aspect of the triplication block TMRB of Embodiment 1.

In Embodiment 1, the majority circuit is disposed only in an output unit of the functional circuit, but in this embodiment, a majority circuit FVOT is inserted into various portions inside a circuit in addition to the output unit of the functional circuit.

A function and a configuration of the majority circuit will be described with a majority circuit FVOT-A1 included in one FBA of triplicated functional circuits as an example. Similar to the majority circuit VOT described in Embodiment 4, characteristics of this majority circuit are directly outputting input values of the functional circuits without performing a majority processing. The majority circuit includes a selector circuit VSEL selecting one signal from two input signals according to values of a majority execution circuit VVOT and a signal FVSELS. According to this configuration, an output of the majority circuit is able to be selected from either of a signal of a majority processing result of three signals from circuit blocks (FB-A1, FB-B1, and FB-C1), and an output signal of the functional circuit FB-A1. The other majority circuit FVOT also has an identical function to that of the majority circuit FVOT.

In this embodiment, by designating the selection signals FVSELS and VSELS in the functional circuit not to perform the majority processing in the majority circuit, it is possible to independently operate three functional circuits FBA, FBB, and FBC.

Thus, the functional circuit is set to perform an independent operation, and executes the input pattern for a preliminarily prepared test, and thus it is possible to independently verify each of the functional circuits. In addition, by setting the independent operation to be performed, it is possible to independently operate the three functional circuits, and it is possible to improve a processing performance. In addition, by setting the independent operation to be performed, it is possible to improve frequency of an operation in which there is no signal propagation across the three functional circuits.

C. APPENDIX

In Embodiment 1 to Embodiment 5 described above, an aspect in which resistance of the functional circuit to the radiation soft error or the like is improved is mainly described. Even when resistance of the other circuit such as the non-volatile memory access circuit or the volatile memory access circuit to the radiation soft error or the like is improved, the same aspect is able to be applied, and the described aspect is not limited to the functional circuit.

In addition, in Embodiment 1 to Embodiment 3, a case where the programmable circuit, the non-volatile memory, the volatile memory, and the functional device are configured in another chip, and a case where some of these circuits are implemented on the same chip are also within a range of the invention. For example, the programmable circuit may include either of the non-volatile memory and the volatile memory therein, or may include both of the memories therein.

Furthermore, the invention is not limited to examples described, and includes various modification examples. For example, the example described above is described in detail in order to allow easy understanding of the invention, and the present invention is not necessarily limited to including all of the described configurations. In addition, a part of a configuration of one example is able to be replaced by a configuration of another example, in addition, the configuration of another example is able to be added to the configuration of one example. In addition, addition, deletion, and replacement of another configuration are able to be performed with respect to a part of a configuration of each example.

In addition, each of the configurations, the functions, the processing units, the processing sections, and the like described above may be realized in hardware by designing a part or all thereof, for example, in the integrated circuit. In addition, each of the configurations, the function, and the like may be realized in software by interpreting and executing a program by which a processor realizes each of the functions. Information such as a program realizing a function, a table, and a file is able to be included in a recording device such as a memory, a hard disk, or a Solid State Drive (SSD), or in a recording medium such as an IC card, an SD card, and a DVD.

In addition, it is considered that a control line or an information line is necessary for description, and both of the control line and the information line are not necessary for a product. In practice, it may be considered that almost all configurations are connected to each other.

What is claimed is:

1. A programmable circuit device, comprising:
a multiplexing block including a plurality of functional circuits which have an identical function and perform an identical processing;
a redundant circuit notifying a diagnosis result of failure of a subject circuit and a comparison result of an output of the plurality of functional circuits without changing the output due to the failure, imparting a significant influence to the output due to the failure, or being multiplexed;
a configuration control circuit copying configuration information according to a notification of the diagnosis result and the comparison result from the redundant circuit;
a non-volatile memory storing functional unit configuration information relevant to the plurality of functional circuits, redundant circuit configuration information relevant to the redundant circuit, and programmable circuit configuration information including configuration information with respect to each circuit in the programmable circuit device which includes the functional unit configuration information and the redundant circuit configuration information;
a volatile memory having a faster reading speed than the non-volatile memory and preliminarily copying the functional unit configuration information from the non-volatile memory; and
an embedded memory having a faster reading speed than the volatile memory and preliminarily copying the redundant circuit configuration information from the non-volatile memory,
wherein when the redundant circuit detects the failure of the subject circuit, the redundant circuit notifies the diagnosis result to the configuration control circuit,
the configuration control circuit reads the redundant circuit configuration information from the embedded memory, writes the information to a configuration memory in the redundant circuit, and thus restores the redundant circuit,
when the redundant circuit detects inconsistency in signals of the plurality of functional circuits, the redundant circuit notifies the comparison result to the configuration control circuit, and
the configuration control circuit reads the functional unit configuration information from the volatile memory, writes the information to each configuration memory of the plurality of functional circuits, and thus restores the plurality of functional circuits.

2. The programmable circuit device according to claim 1, wherein the redundant circuit includes a comparison circuit which determines failure by comparing outputs or signals of the plurality of functional circuits, and a first diagnosis circuit which detects failure of the comparison circuit, and the redundant circuit configuration information includes configuration information relevant to the comparison circuit, and
the redundant circuit includes a majority circuit which performs a majority processing with respect to the outputs or the signals of the plurality of functional circuits and outputs a result of the majority processing to the volatile memory, the non-volatile memory, and an external communication circuit, and a second diagnosis circuit which detects failure of the majority circuit, and the redundant circuit configuration information includes configuration information relevant to the majority circuit.

3. The programmable circuit device according to claim 2, wherein when the comparison circuit detects the failure in the subject circuit by the first diagnosis circuit, the comparison circuit notifies the diagnosis result to the configuration control circuit, and the configuration control circuit issues an output stop request with respect to the plurality of functional circuits according to the diagnosis result, reads the configuration information relevant to the comparison circuit from the embedded memory, and writes the information to a configuration memory in the comparison circuit, and thus restores the comparison circuit, and then cancels the output stop request with respect to the plurality of functional circuits.

4. The programmable circuit device according to claim 2, wherein when the majority circuit detects failure in the subject circuit by the second diagnosis circuit, the majority circuit notifies the diagnosis result to the configuration control circuit, and the configuration control circuit issues an output stop request with respect to the plurality of functional circuits according to the diagnosis result, reads the configuration information relevant to the majority circuit from the embedded memory, and writes the information to a configuration memory in the majority circuit, and thus restores the majority circuit, and then cancels the output stop request with respect to the plurality of functional circuits.

5. The programmable circuit device according to claim 2, wherein when the comparison circuit detects inconsistency in the outputs of the plurality of functional circuits, the comparison circuit notifies the comparison result to the configuration control circuit, and the configuration control circuit reads the functional unit configuration information from the volatile memory according to the comparison result, and writes the information to the configuration memory in the plurality of functional circuits, and thus restores the plurality of functional circuits.

6. The programmable circuit device according to claim 5, wherein the configuration control circuit restores each configuration memory of the plurality of functional circuits without stopping the plurality of functional circuits unless it is detected that all circuit outputs are different from each other by the comparison circuit.

7. The programmable circuit device according to claim 2, wherein the majority circuit is configured to select any signal from a signal of a majority processing result of the outputs of the plurality of functional circuits and each output signal of the plurality of functional circuits.

8. The programmable circuit device according to claim 2, wherein in the majority circuit, a circuit for a majority is further inserted into a plurality of portions inside each of the functional circuits in addition to an output unit of the plurality of functional circuits.

9. The programmable circuit device according to claim 1, wherein the configuration control circuit reads the programmable circuit configuration information stored in the non-volatile memory, and writes the information to a configuration memory of each circuit in the programmable circuit, and thus configures a programmable circuit, and the configuration control circuit reads the functional unit configuration information from the non-volatile memory and writes the information to the volatile memory, and reads the redundant configuration information from the non-volatile memory and writes the information to the embedded memory, and thus copies each configuration information item.

10. The programmable circuit device according to claim 1, further comprising:

a switch device arranged between the non-volatile memory and the functional device, and the programmable circuit device; and an IO control circuit for controlling the switch device, wherein the IO control circuit controls the switch device, selects the non-volatile memory, and connects the non-volatile memory to the programmable circuit device, the configuration control circuit reads the programmable circuit configuration information stored in the non-volatile memory, and writes the information to the configuration memory of each of the circuits in the programmable circuit, and thus configures the programmable circuit, the configuration control circuit reads the functional unit configuration information from the non-volatile memory and writes the information to the volatile memory, and reads the redundant configuration information from the non-volatile memory and writes the information to the embedded memory, and thus copies each of the configuration information items, the configuration control circuit notifies completion of copying to the IO control circuit after the copying of the respective configuration information items is completed, and the IO control circuit controls the switch device such that a connection with respect to the programmable circuit device is switched from the non-volatile memory to the functional device according to the completion of the copying.

11. The programmable circuit device according to claim 10, wherein the non-volatile memory further includes software information, when the IO control circuit controls the switch device, selects the non-volatile memory, and connects the non-volatile memory to the programmable circuit device, each of the plurality of functional circuits copies the software information into the volatile memory from the non-volatile memory, and notifies completion of copying into the IO control circuit, and the IO control circuit controls the switch device such that the connection with respect to the programmable circuit is switched from the non-volatile memory to the functional device after copying of the programmable circuit configuration information and the software information is completed.

12. The programmable circuit device according to claim 1, wherein the plurality of functional circuits are duplicated, and two functional circuits have an identical function and perform an identical processing, and among the two functional circuits, an output of one functional circuit is set to an output of the multiplexing block, and outputs of both of the functional circuits are input into the redundant circuit.

13. The programmable circuit device according to claim 1, wherein when the redundant circuit detects inconsistency in outputs of the plurality of functional circuits, the redundant circuit notifies the comparison result to the configuration control circuit, and when the comparison result is notified, the configuration control circuit notifies an outside of the programmable circuit that failure has occurred, resets the plurality of functional circuits and restarts the processing after restoration of each of the configuration memories in the plurality of functional circuits is completed, and notifies the outside of the programmable circuit device that the restoration is completed.

14. The programmable circuit device according to claim 1, wherein either of the non-volatile memory and the volatile memory, or both of the non-volatile memory and the volatile memory are provided in the programmable circuit.

15. A configuration information restoration method of a programmable circuit device which includes a multiplexing block including a plurality of functional circuits which have an identical function and perform an identical processing, a redundant circuit notifying a diagnosis result of failure of a subject circuit and a comparison result of an output of the plurality of functional circuits without changing the output due to the failure, imparting a significant influence to the output due to the failure, or being multiplexed, and a configuration control circuit copying configuration information according to a notification of the diagnosis result and the comparison result from the redundant circuit, the method comprising:

storing functional unit configuration information relevant to the plurality of functional circuits, redundant circuit configuration information relevant to the redundant circuit, and programmable circuit configuration information including configuration information with respect to each circuit in the programmable circuit device which includes the functional unit configuration information and the redundant circuit configuration information in a non-volatile memory;

preliminarily copying the functional unit configuration information from the non-volatile memory into a volatile memory having a faster reading speed than the non-volatile memory; and preliminarily copying the redundant circuit configuration information from the non-volatile memory into an embedded memory having a faster reading speed than the volatile memory, wherein when the redundant circuit detects the failure of the subject circuit, the redundant circuit notifies the diagnosis result to the configuration control circuit, the configuration control circuit reads the redundant circuit configuration information from the embedded memory, writes the information to a configuration memory in the redundant circuit, and thus restores the redundant circuit, when the redundant circuit detects inconsistency in signals of the plurality of functional circuits, the redundant circuit notifies the comparison result to the configuration control circuit, and the configuration control circuit reads the functional unit configuration information from the volatile memory, writes the information to each configuration memory of the plurality of functional circuits, and thus restores the plurality of functional circuits.

* * * * *